(12) United States Patent
Ko et al.

(10) Patent No.: US 8,436,529 B2
(45) Date of Patent: May 7, 2013

(54) ORGANIC LIGHT EMITTING DISPLAY AND METHOD OF MANUFACTURING THE SAME

(75) Inventors: Chun-Seok Ko, Yongin (KR); Jang-Doo Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 245 days.

(21) Appl. No.: 12/965,781

(22) Filed: Dec. 10, 2010

(65) Prior Publication Data

US 2012/0044221 A1 Feb. 23, 2012

(30) Foreign Application Priority Data

Aug. 20, 2010 (KR) ........................ 10-2010-0080850

(51) Int. Cl.
*H01J 1/62* (2006.01)
(52) U.S. Cl.
USPC .......................................... 313/504; 313/506
(58) Field of Classification Search .................. 313/498, 313/504, 506, 512
See application file for complete search history.

(56) References Cited

U.S. PATENT DOCUMENTS

| | | |
|---|---|---|
| 2003/0102424 A1 | 6/2003 | Izumi et al. |
| 2004/0170927 A1 | 9/2004 | Pichler |
| 2005/0139841 A1 | 6/2005 | Park |
| 2006/0192496 A1 | 8/2006 | Yamada |
| 2007/0134830 A1 | 6/2007 | Park et al. |
| 2007/0278952 A1 | 12/2007 | Sung et al. |

FOREIGN PATENT DOCUMENTS

| | | |
|---|---|---|
| EP | 2 081 178 A2 | 7/2009 |
| JP | 2007-316509 | 12/2007 |
| KR | 10-2001-0060498 | 7/2001 |
| KR | 10-2007-0080997 | 8/2007 |

OTHER PUBLICATIONS

Extended European Search Report dated Aug. 11, 2011 issued in Patent Application No. 11151523.5 which claims priority to Korean Patent Application No. 10-2010-0080850.

*Primary Examiner* — Vip Patel
(74) *Attorney, Agent, or Firm* — Christie, Parker & Hale, LLP

(57) ABSTRACT

An organic light emitting display includes: an organic light emitting display panel including a display unit; pixel power source out lead bonding (OLB) pads located on first through fourth external side edges of the display unit to supply a pixel power to the display unit; pixel power source lines coupled to the pixel power source OLB pads to provide the pixel power to the display unit; pixel power supply flexible printed circuit boards bonded to the pixel power source OLB pads; signal OLB pads located on at least one external side edge among the first through fourth external side edges to supply a plurality of driving signals to the display unit; signal lines coupled to the signal OLB pads to provide the driving signals to the display unit; and tape carrier packages mounted with driving ICs and bonded to the signal OLB pads.

12 Claims, 4 Drawing Sheets

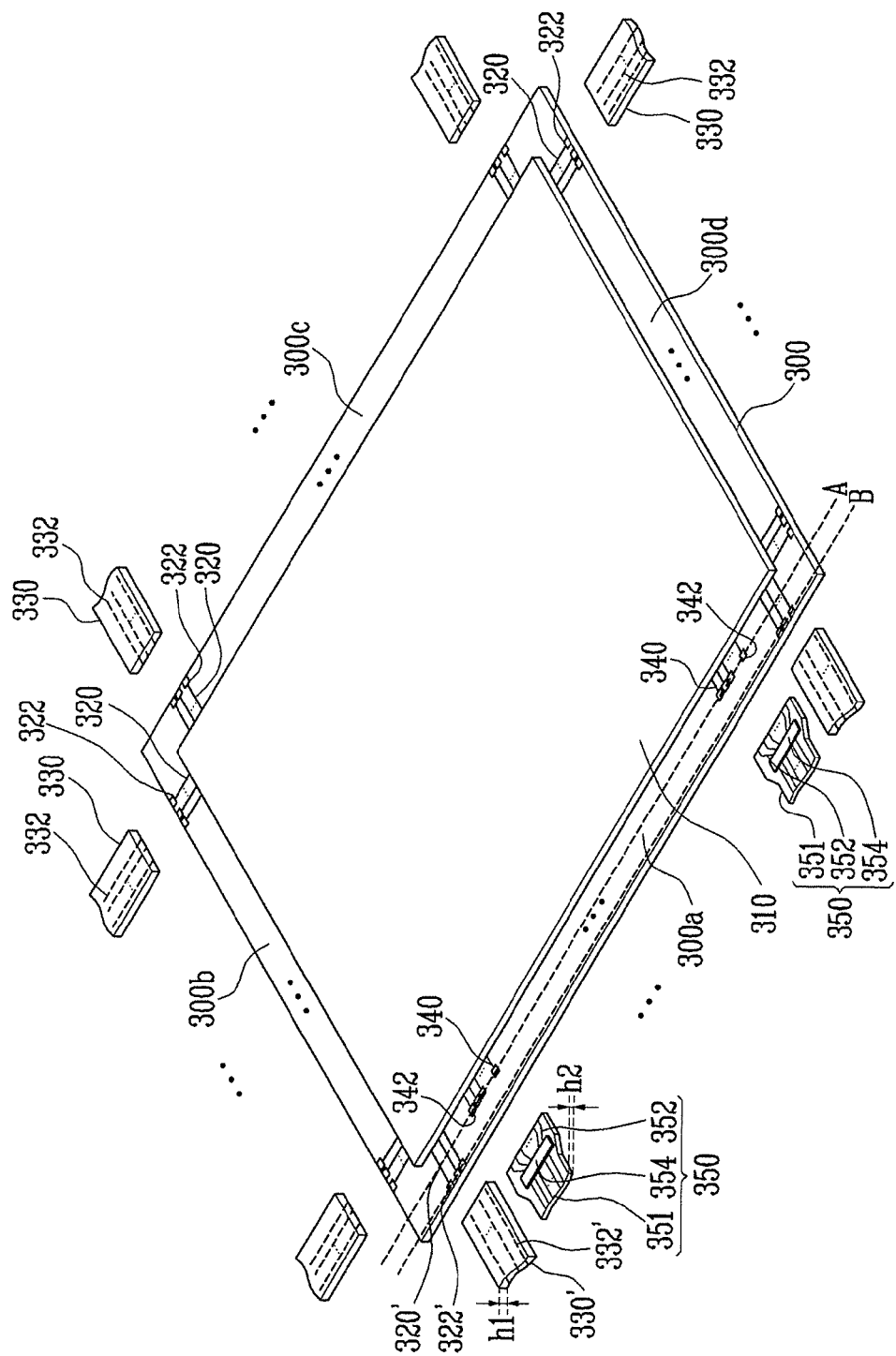

ORGANIC LIGHT EMITTING DISPLAY AND METHOD OF MANUFACTURING THE SAME

CROSS-REFERENCE TO RELATED APPLICATION

This application claims priority to and the benefit of Korean Patent Application No. 10-2010-0080850, filed on Aug. 20, 2010, in the Korean Intellectual Property Office, the entire content of which is incorporated herein by reference.

BACKGROUND

1. Field

Embodiments of the present invention relate to an organic light emitting display and a method of manufacturing the same.

2. Description of the Related Art

Among flat panel displays (FPDs), the organic light emitting displays display images using organic light emitting diodes (OLEDs) that generate light by a recombination of electrons and holes. The organic light emitting display has high response speed and is driven with low power consumption and thus has been spotlighted as a next generation display.

In general, an OLED display includes a display unit having a plurality of pixels, driving circuits for supplying driving signals to the display unit, and a pixel power source for supplying a pixel power to the display unit.

The pixels are synchronized with scan signals when the scan signals are supplied to emit light having brightness corresponding to supplied data signals so that the display unit displays an image (e.g., a predetermined image).

In an organic light emitting display, the emission brightness of the pixels are affected by the voltage of the pixel power. That is, the pixel power determines the emission brightness together with the data signals.

Therefore, in order to display an image with a more uniform picture quality, the pixel power having a more uniform or the same voltage can be supplied to the pixels.

However, the pixel power source typically is a direct current (DC) power source having a voltage level (e.g., a predetermined voltage level) and an IR drop (e.g., a voltage drop) is generated while passing through a power source line (e.g., while the voltage passes through a power source line).

In particular, as the size of the display panel of the organic light emitting display increases, the length of the power source line increases so that the variation in the brightness of the pixels increases in accordance with the distance between the pixel power source and a power source pad that receives a pixel power from the pixel power source.

SUMMARY

Accordingly, aspects of embodiments of the present invention are directed to an organic light emitting display in which flexible printed circuit boards (FPCB) for supplying pixel power are attached on the external side edges of a display unit to apply the pixel power to the four edges of the display unit and to reduce or minimize the IR drop of the pixel power supplied to the display unit.

Aspects of embodiments of the present invention are also directed to an organic light emitting display in which signal out lead bonding (OLB) pads electrically coupled to a driving IC and pixel power source OLB pads electrically coupled to a pixel power source are formed in separate regions on the external side edge among the external side edges of the display unit where a tape carrier package (TCP) mounted with the driving IC is attached so that large hot bars may be used when the TCP and the flexible printed circuit boards (FPCBs) for supplying the pixel power are bonded to the display to improve manufacturing process yield and tact time and a method of manufacturing the same.

According to one embodiment of the present invention, an organic light emitting display includes an organic light emitting display panel including a display unit, a plurality of pixel power source out lead bonding (OLB) pads located on first, second, third, and fourth external side edges of the display unit to supply a pixel power to the display unit, a plurality of pixel power source lines coupled to the pixel power source OLB pads to provide the pixel power to the display unit, a plurality of pixel power source flexible printed circuit boards (FPCBs) bonded to the pixel power source OLB pads, a plurality of signal OLB pads located on at least one external side edge among the first, second, third, and fourth external side edges to supply a plurality of driving signals to the display unit, a plurality of signal lines coupled to the signal OLB pads to provide the driving signals to the display unit, and a plurality of tape carrier packages (TCPs) mounted with driving ICs and bonded to the signal OLB pads.

In addition, the signal OLB pads and the pixel power source OLB pads located on a same external side edge may be respectively located in a first region and a second region that are separate from each other.

The signal OLB pads bonded to the TCPs may be arranged along a first line and the pixel power source OLB pads bonded to the pixel power source FPCBs may be arranged along a second line. The first line may be located closer to the display unit than the second line.

The pixel power may include at least one of a first pixel power or a second pixel power. The driving signals may be scan signals and/or data signals.

Each of the TCPs may include a base film, a plurality of driving ICs mounted on the base film, and a plurality of line patterns formed on the base film and electrically coupled to the signal OLB pads.

According to one embodiment of the present invention, a method of manufacturing an organic light emitting display includes bonding a plurality of tape carrier packages (TCPs) mounted with a plurality of driving ICs to a first region of at least one side edge among a plurality of external side edges of an organic light emitting display panel including a display unit, and bonding a plurality of pixel power source flexible printed circuit boards (FPCBs) to each of the external side edges of the organic light emitting display panel, wherein the pixel power source FPCBs bonded to the external side edges to which the TCPs are bonded may be bonded in a second region different from the first region.

The TCPs may be bonded to a plurality of signal out lead bonding (OLB) pads located in a first region of an external side edge of the organic light emitting display panel and electrically coupled to the signal OLB pads.

The pixel power source FPCBs may be bonded to a plurality of pixel power source out lead bonding (OLB) pads located on each of the external side edges of the organic light emitting display panel and electrically coupled to the pixel power source OLB pads.

The first region may be located closer to the display unit than the second region.

The TCPs may be bonded by positioning one end of each of the TCPs to overlap a signal out lead bonding (OLB) bonding pad located in the first region, interposing an anisotropic conductive film (ACF) between the TCPs and the signal OLB pads, and applying heat and pressure using hot bars.

The pixel power source FPCBs bonded to the same external side edge together with the TCPs may be bonded by positioning one end of each of the FPCBs to overlap a pixel power source out lead bonding (OLB) pad located in the second region, by interposing an anisotropic conductive film (ACF) between the FPCBs and a plurality of signal OLB pads, and applying heat and pressure using hot bars.

As described above, according to embodiments of the present invention, the FPCBs for supplying the pixel power source are attached onto the external side edges of the display unit so that the pixel power is applied to the four edges of the display unit through the FPCBs and that the IR drop of the pixel power supplied to the display unit is reduced or minimized.

In addition, on the external side edge where the TCP mounted with the driving IC is attached among the external side edges of the display unit, the signal OLB pads electrically coupled to the driving IC and the plurality of pixel power source OLB pads electrically coupled to the pixel power source are formed in separate regions. Bonding the TCP and bonding the FPCBs for supplying the pixel power are separated so that bonding defect may be recovered or reduced although large hot bars may be used and that manufacturing process yield and tact time may be improved.

BRIEF DESCRIPTION OF THE DRAWINGS

The accompanying drawings, together with the specification, illustrate exemplary embodiments of the present invention, and, together with the description, serve to explain the principles of the present invention.

FIG. 3 is an exploded perspective view of an organic light emitting display panel according to one embodiment of the present invention.

DETAILED DESCRIPTION

Figure 1:
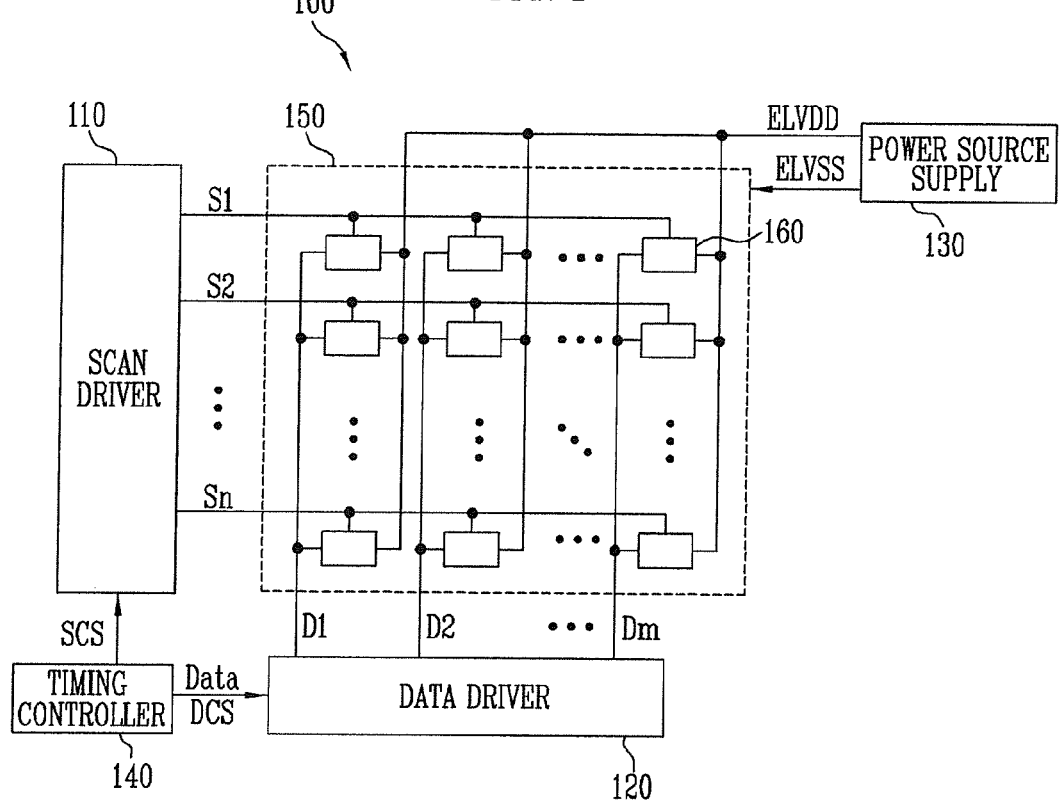
FIG. 1 is a block diagram illustrating an example of an organic light emitting display according to one embodiment of the present invention.

Hereinafter, certain exemplary embodiments according to the present invention will be described with reference to the accompanying drawings. Here, when a first element is described as being coupled to a second element, the first element may be directly coupled to the second element or may be indirectly coupled to the second element via a third element. Further, some of the elements that are not essential to the complete understanding of the invention are omitted for clarity. Also, like reference numerals refer to like elements throughout.

Hereinafter, an embodiment of the present invention will be described in detail with reference to the accompanying drawings.

FIG. 1 is a block diagram illustrating an organic light emitting display according to one embodiment of the present invention.

Referring to FIG. 1, according to one embodiment of the present invention, an organic light emitting display 100 includes a scan driver 110, a data driver 120, a timing controller 140, a display unit 150, and a power source supply 130.

The scan driver 110 generates scan signals in accordance with scan driving control signals SCS supplied from the timing controller 140. The scan signals generated by the scan driver 110 are sequentially supplied to scan lines S1 to Sn.

The data driver 120 generates data signals in accordance with data Data and the data driving control signals DCS supplied from the timing controller 140. The data signals generated by the data driver 120 are supplied to data lines D1 to Dm in synchronization with the scan signals.

The timing controller 140 generates the scan driving control signals SCS and the data driving control signals DCS in accordance with synchronizing signals supplied from the outside. The scan driving control signals SCS generated by the timing controller 140 are supplied to the scan driver 110 and the data driving control signals DCS are supplied to the data driver 120. In addition, the timing controller 140 transmits the data Data supplied from the outside to the data driver 120.

The display unit 150 includes a plurality of pixels 160 formed at crossing regions of the scan lines S1 to Sn and the data lines D1 to Dm. The display unit 150 displays an image in accordance with the scan signals supplied from the scan driver 110 and the data signals supplied from the data driver 120.

The power source supply 130 generates a first pixel power ELVDD and a second pixel power ELVSS using an external power supplied from an external power source supply apparatus (not shown). The power source supply 130 supplies the generated first and second pixel powers ELVDD and ELVSS to the display unit 150.

In the organic light emitting display 100, the display unit 150 is formed in the organic light emitting display panel.

The scan driver 110 and/or the data driver 120 is directly mounted in the organic light emitting display or is electrically coupled to the scan lines and/or the data lines, respectively, formed in the display unit 150 through a tape carrier package (TCP).

The TCP includes a base film and a driver IC mounted on the base film and is bonded to out lead bonding (OLB) pads provided on one end of each of the scan lines and/or the data lines. The bonding of the TCP may be formed by heat and pressure using a hot bar.

The power source supply 130 and/or the timing controller 140 is mounted on a driving board outside an organic light emitting display panel to be coupled to an organic light emitting display panel through a flexible printed circuit board (FPCB).

The FPCB may be coupled to the organic light emitting display panel by OLB bonding using the hot bar as described above.

Figure 2:
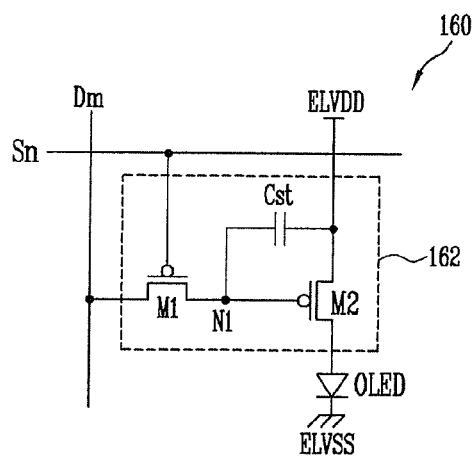
FIG. 2 is a circuit diagram illustrating an example of a pixel which may be used with the display of FIG. 1.

FIG. 2 is a circuit diagram illustrating a pixel which may be used with the display of FIG. 1. For the sake of convenience, in FIG. 2, a pixel 160 of the display unit 150 coupled to the nth scan line Sn and the mth data line Dm will be described.

Referring to FIG. 2, a pixel 160 includes an organic light emitting diode (OLED), a scan line Sn, a data line Dm, a first pixel power source for supplying the first pixel power ELVDD, and a pixel circuit 162 coupled to the OLED.

The anode electrode of the OLED is coupled to the pixel circuit 162 and the cathode electrode of the OLED is coupled to a second pixel power source for supplying the second pixel power ELVSS. The OLED emits light having brightness in accordance with the amount of current supplied from the pixel circuit 162.

The pixel circuit 162 includes a first transistor M1, a second transistor M2, and a storage capacitor Cst.

The first electrode of the first transistor M1 is coupled to the data line Dm and the second electrode of the first transistor M1 is coupled to a first node N1. The gate electrode of the first transistor M1 is coupled to the scan line Sn. The first transistor M1 is turned on when a scan signal is supplied to the scan line Sn to transmit a data signal supplied to the data line Dm to the first node N1.

The first electrode of the second transistor M2 is coupled to the first pixel power source for supplying the first pixel power ELVDD and the second electrode of the second transistor M2 is coupled to the anode electrode of the OLED. The gate electrode of the second transistor M2 is coupled to the first node N1. The second transistor M2 controls current that flows from the first pixel power source to the anode electrode of the OLED in accordance with the voltage supplied to the gate electrode of the second transistor M2.

One terminal of the storage capacitor Cst is coupled to the first node N1 and the other terminal of the storage capacitor Cst is coupled to the first pixel power source and the first electrode of the second transistor M2. The storage capacitor Cst stores the voltage corresponding to the data signal supplied to the first node N1 when the scan signal is supplied to the scan line Sn and maintains the stored voltage during one frame.

The operation processes of the pixel 160 will be described in more detail. First, when the scan signal is supplied to the scan line Sn, the first transistor M1 is turned on. When the first transistor M1 is turned on, the data signal supplied to the data line Dm is transmitted to the first node N1 via the first transistor M1. When the data signal is transmitted to the first node N1, the voltage corresponding to a difference between the voltage of the first pixel power ELVDD and the data signal is charged in the storage capacitor Cst. Then, the second transistor M2 controls the current that flows from the first pixel power source to the OLED in accordance with the voltage supplied to the gate electrode of the second transistor M2. The OLED emits light in accordance with the amount of current supplied thereto to display an image.

As described above, the pixel 160 emits light having a brightness in accordance with the amount of current supplied through the second transistor M2. The voltage of the first node N1, to which the gate electrode of the second transistor M2 is coupled, is sustained by the storage capacitor Cst during one frame.

The storage capacitor Cst stores a voltage corresponding to a difference between the voltage of the first pixel power ELVDD and a data signal while the data signal is supplied and maintains the voltage during one frame. Therefore, the emission brightness of the pixel 160 varies in accordance with the voltage of the first pixel power ELVDD and the data signal.

The voltage of the first pixel power ELVDD supplied to the pixels 160 may vary in accordance with the IR drop generated while the first pixel power ELVDD passes through a power source line. Therefore, the pixels 160 that receive the same data signal emit light with different brightness so that picture quality may deteriorate.

Therefore, aspects of embodiments of the present invention are directed to an apparatus for or a method of reducing or minimizing the IR drop of the first pixel power ELVDD.

FIG. 3 is an exploded perspective view of an organic light emitting display panel according to one embodiment of the present invention.

In FIG. 3, according to one embodiment of the present invention, a scan driver and/or a data driver are mounted in tape carrier packages (TCP) and the TCPs are attached to the same side edge of an organic light emitting display panel. However, embodiments of the present invention is not limited to the above.

For example, the TCP in which the scan driver is mounted and the TCP in which the data driver is mounted may be attached to different side edges of the organic light emitting display panel.

Referring to FIG. 3, an organic light emitting display panel 300 according to one embodiment of the present invention includes a display unit 310 positioned at the center, a plurality of pixel power source out lead bonding (OLB) pads 322 and 322' positioned on the first to fourth external side edges 300a to 300d of the display unit 310 to supply pixel power to the display unit 310, and pixel power source lines 320 and 320' coupled to the pixel power source OLB pads 322 and 322' to provide the pixel power to the display unit 310. The pixel power may be the first pixel power ELVDD and/or the second pixel power ELVSS.

In addition, the pixel power source OLB pads 322 and 322' are bonded to one side of each of the pixel power source FPCBs 330 and 330' and the pixel power is applied through a printed circuit board (PCB) bonded to the other sides of the pixel power source FPCBs 330 and 330'. In one embodiment, a power source supply (130 of FIG. 1) is mounted on the PCB.

Single or multiple layer line patterns 332 and 332' are formed in the pixel power source FPCBs 330 and 330'.

According to one embodiment of the present invention, organic light emitting display panel 300 further includes signal lines 340 positioned on one edge among the external side edges, for example, on the first external side edge 300a and coupled to a plurality of signal OLB pads 342 for supplying the scan signals and/or the data signals to the display unit 310 to provide the scan signals and/or the data signals to the display unit 310. The signal lines 340 may be scan lines or data lines.

The signal OLB pads 342 are bonded to one side of each of the TCPs 350. The scan lines and/or the data signals are applied through the PCB bonded to the other sides of the TCPs 350. In one embodiment of the present invention, a timing controller (140 of FIG. 1) is mounted on the PCB.

According to one embodiment of the present invention, the TCP 350 includes a base film 351, a driving IC 354 mounted on the base film 351, and a plurality of line patterns 352.

In addition, the display unit 310 includes a plurality of pixels. The display unit 310 displays images in accordance with the scan signals and the data signals supplied through the signal OLB pads 342 and the pixel power (e.g., ELVDD or ELVSS) supplied through the pixel power source OLB pads 322 and 322'.

As described above, due to the IR drop generated when the pixel power passes through the power source line formed in the display unit, the voltage of the first pixel power ELVDD supplied to the pixels 160 may vary so that pixels 160 that receive the same data signal may emit light having different brightness such that picture quality deteriorates.

In one embodiment of the present invention, as illustrated in FIG. 3 and as described above, the pixel power source FPCBs 330 and 330' are attached on the external side edges of the display unit 310 so that the pixel power is applied to the four edges of the display unit 310 and that the IR drop of the pixel power source supplied to the display unit 310 may be reduced or minimized.

That is, in one embodiment of the present invention, the pixel power source OLB pads 322 and 322' of the organic light emitting display panel 300 are dispersed into the entire external regions (e.g., all four sides) of the display unit 310 so that the pixel power is supplied to the display unit 310 from upper and lower sides (or edges) and left and right sides (or edges) and that the IR drop of the pixel power source in the display unit 310 is reduced or minimized.

Therefore, although the size of the organic light emitting display panel 300 increases, an image with more uniform picture quality may be displayed. Therefore, the organic light emitting display may be applied to various display apparatuses such as a TV or an electronic display board so that organic light emitting displays may be more useful.

According to one embodiment of the present invention, the TCPs 350 mounted with the driving ICs are be bonded to the at least one side edge among the external side edges of the display unit 310. In one embodiment of the present invention, the TCPs 350 are positioned on the first external side edge 300a among the external side edges.

In this case, as illustrated in FIG. 3, the pixel power source FPCB 330' located on the first external side edge 300a is located between the TCPs 350 to be bonded.

According to one embodiment of the present invention, the pixel power source FPCB 330' and the TCPs 350 formed on the first external side edge 300a are bonded using a hot bar through heat and pressure.

One end of each of the pixel power source FPCB 330' and the TCPs 350 formed on the first external side edge 300a is positioned to overlap the pixel power source OLB bonding pad 322' and the signal OLB bonding pads 342, respectively, of the panel and an anisotropic conductive film (ACF) is interposed between the pixel power source OLB bonding pad 322' and the signal OLB bonding pad 342. Then, heat and pressure are applied using the hot bar so that bonding is performed.

However, in general, since the thickness h2 of the base films 351 of the TCPs 350 is smaller than the thickness h1 of the FPCB 330', if bonding is performed along the same line, an anisotropic conductive film (ACF) conductive ball on the side of the TCP 350 having a relatively small thickness does not properly burst so that a bonding defect may be generated. This bonding defect may deteriorate display picture quality.

In one embodiment of the present invention, the signal OLB pads 342 bonded to the TCPs 350 and the pixel power source OLB pads 322' bonded to the pixel power source FPCB 330' are formed in separate regions and bonding the TCPs 350 and bonding the pixel power source FPCB 330' are separated from each other so that the bonding defect may be recovered while using large hot bars and so that manufacturing process yield and tact time (or takt time) may be improved.

In addition, as illustrated in FIG. 3, in one embodiment of the present invention, the signal OLB pads 342 bonded to the TCPs 350 are arranged on a first line A, the OLB pads 322' bonded to the pixel power source FPCBs 330' are arranged in a second line B, and the first line A is positioned closer to the display unit 310 than the second line B.

When the TCPs 350 and the pixel power source FPCB 330' are bonded, the TCPs 350 are first bonded and the pixel power source FPCB 330' is bonded later so that a bonding defect due to the thickness h2 of the base films 351 of the TCPs 350 being smaller than the thickness h1 of the FPCB 330' may be reduced or solved.

Hereinafter, the manufacturing method of the organic light emitting display according to one embodiment of the present invention, that is, bonding the TCPs and the pixel power source FPCB will be described in more detail.

Figure 4A:
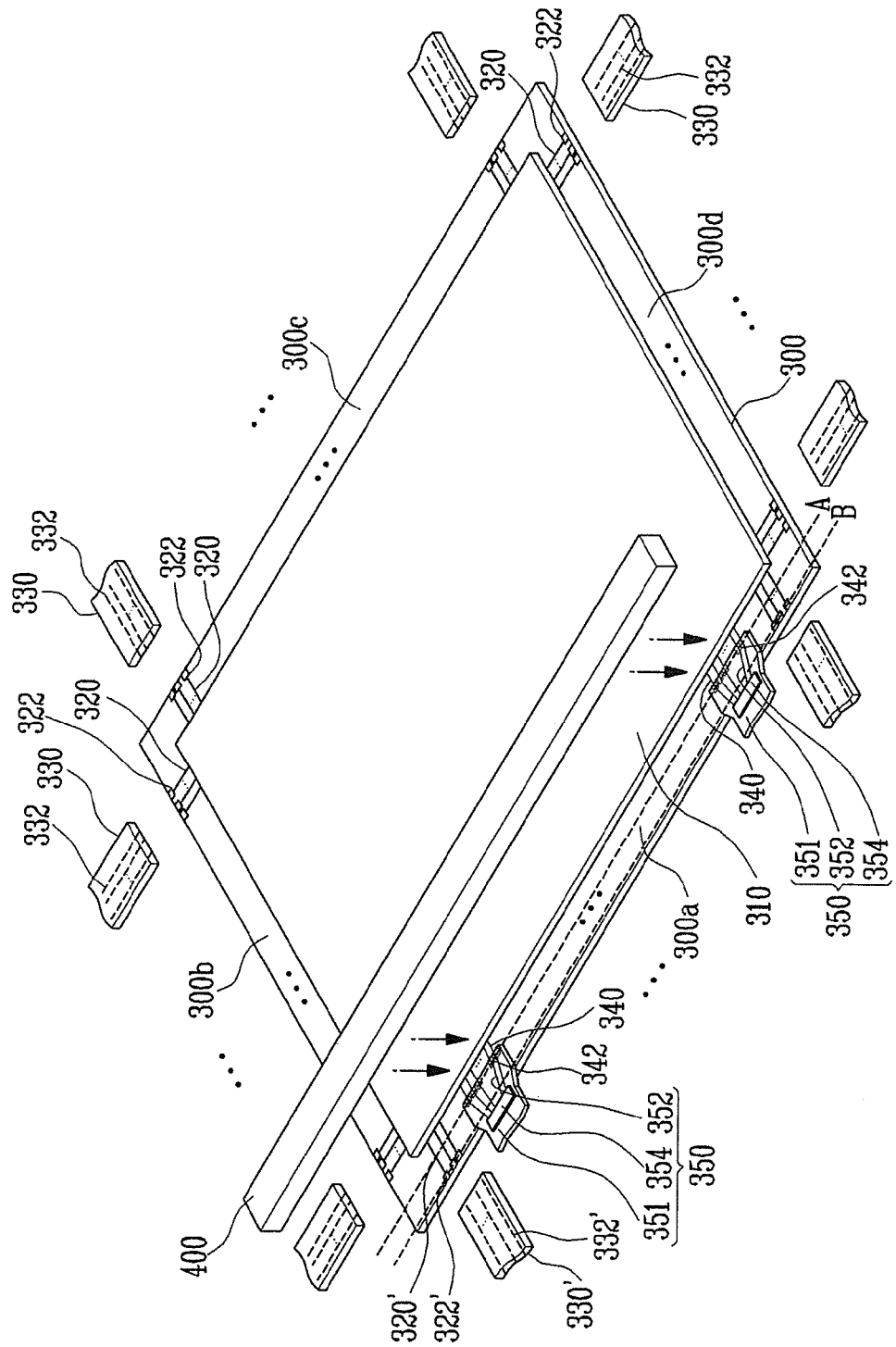
FIG. 4A and FIG. 4B illustrate a method of manufacturing an organic light emitting display according to one embodiment of the present invention.
Figure 4B:
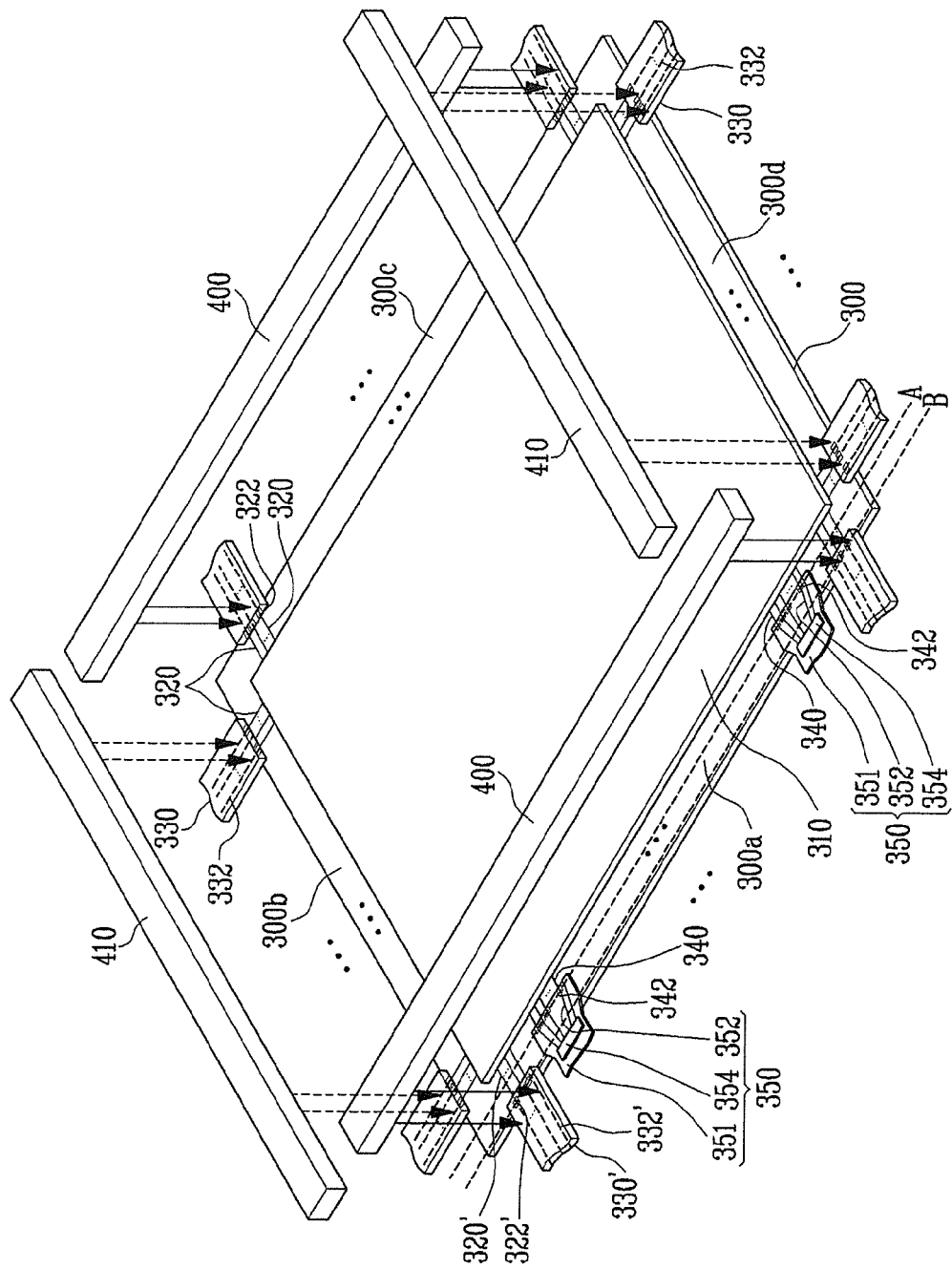

FIG. 4A and FIG. 4B illustrate a method of manufacturing an organic light emitting display according to one embodiment of the present invention.

The same components as FIG. 3 are denoted by the same reference numerals and detailed description thereof will be omitted.

First, referring to FIG. 4A, the TCPs 350 mounted with driving ICs 354 are bonded in a first region of at least one edge (e.g., the first external side edge 300a) among the external side edges of the organic light emitting display panel 300.

The first region corresponds to the first line A to be adjacent to the display unit 310 and the signal OLB pads 342 bonded to the TCPs 350 are arranged in the first region, that is, on the first line A.

In addition, the TCPs 350 are bonded by a large hot bar 400 having a length corresponding to the longitudinal axis length of the organic light emitting display panel 300 as illustrated in FIG. 4A.

One end of each of the TCPs 350 formed on the first external side edge 300a is positioned to overlap the OLB bonding pad 342 arranged on the first line A and the ACF is interposed between the TCPs 350 and the OLB bonding pads 342. Then, heat and pressure are applied using the hot bar so that bonding is performed.

When bonding of the TCPs 350 is completed in the first region of the first external side edge 300a, as illustrated in FIG. 4B, the pixel power source FPCBs 330 and 330' are also bonded to the external side edges 300a, 300b, 300c, and 300d of the organic light emitting display panel 300.

The pixel power source FPCBs 330 and 330' are bonded by large hot bars 400 and 410 as described above.

That is, the pixel power source FPCBs 330 and 330' are bonded to the second and fourth external side edges 300b and 300d by the large hot bars 410 having lengths corresponding to the shorter length of the organic light emitting display panel 300 and are bonded to the first and third external side edges 300a and 300c by the large hot bars 400 having lengths corresponding to the longer length of the organic light emitting display panel 300.

The pixel power source FPCBs 330 and 330' are bonded to the first external side edge 300a in a second region different from the first region 300a in which the TCP 350 is bonded. The second region corresponds to the second line B, which is farther from the display unit 310 than the first line A.

In one embodiment of the present invention, the pixel power source OLB pads 322' bonded to the pixel power source FPCB 330' are arranged on the second line B.

One end of the pixel power source FPCB 330 formed on the side edges 300a, 300b, and 300c is positioned to overlap the pixel power source OLB pads 322 positioned on the ends of the side edges of the panel and the ACF is interposed between the pixel power source FPCB 330 and the pixel power source OLB pads 322. Then, heat and pressure are applied using the hot bars 400 and 410 so that bonding is performed.

One end of the pixel power source FPCB 330' formed on the first external side edge 300a is positioned to overlap the pixel power source OLB bonding pad 322' provided on the second line B and the ACF is interposed between the pixel power source FPCB 330' and the pixel power source OLB bonding pad 322'. Then, heat and pressure are applied using the hot bars 400 so that bonding is performed.

According to one embodiment of the present invention, the signal OLB pads 342 and the pixel power source OLB pads 322' formed on the same external side edge are formed in separate regions, that is, the first region and the second region. Bonding the TCPs 350 and bonding the pixel power source FPCBs 330' are separated from each other so that bonding defect may be recovered while using large hot bars so that manufacturing process yield and tact time may be improved.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display comprising:
   an organic light emitting display panel comprising a display unit;
   a plurality of pixel power source out lead bonding (OLB) pads located on first, second, third, and fourth external side edges of the display unit to supply a pixel power to the display unit, the pixel power comprising at least a first pixel power and a second pixel power;
   a plurality of pixel power source lines coupled to the pixel power source OLB pads to provide the pixel power to the display unit;
   a plurality of pixel power source flexible printed circuit boards (FPCBs) bonded to the pixel power source OLB pads and configured to supply the first pixel power and the second pixel power to each of the first, second, third, and fourth external side edges of the display unit;
   a plurality of signal OLB pads located on at least one external side edge among the first, second, third, and fourth external side edges to supply a plurality of driving signals to the display unit;
   a plurality of signal lines coupled to the signal OLB pads to provide the driving signals to the display unit; and
   a plurality of tape carrier packages (TCPs) mounted with driving ICs and bonded to the signal OLB pads.

2. The organic light emitting display as claimed in claim 1, wherein the signal OLB pads and the pixel power source OLB pads located on a same one of the external side edges are respectively located in a first region and a second region that are separate from each other.

3. The organic light emitting display as claimed in claim 2, wherein the signal OLB pads bonded to the TCPs are arranged along a first line, and
   wherein the pixel power source OLB pads bonded to the pixel power source FPCBs are arranged along a second line.

4. The organic light emitting display as claimed in claim 3, wherein the first line is located closer to the display unit than the second line.

5. The organic light emitting display as claimed in claim 1, wherein the driving signals comprise scan signals and/or data signals.

6. The organic light emitting display as claimed in claim 1, wherein each of the TCPs comprises:
   a base film;
   a plurality of driving ICs mounted on the base film; and
   a plurality of line patterns formed on the base film and electrically coupled to the signal OLB pads.

7. A method of manufacturing an organic light emitting display comprising:
   bonding a plurality of tape carrier packages (TCPs) mounted with a plurality of driving ICs to a first region of at least one side edge among a plurality of external side edges of an organic light emitting display panel comprising a display unit; and
   bonding a plurality of pixel power source flexible printed circuit boards (FPCBs) to each of the external side edges of the organic light emitting display panel, the pixel power source FPCBs being configured to supply a first pixel power and a second pixel power to each of the external side edges of the organic light emitting display panel,
   wherein the pixel power source FPCBs bonded to the external side edges to which the TCPs are bonded are bonded in a second region different from the first region.

8. The method as claimed in claim 7, wherein the TCPs are bonded to a plurality of signal out lead bonding (OLB) pads located in a first region of a corresponding one of the external side edges of the organic light emitting display panel and electrically coupled to the signal OLB pads.

9. The method as claimed in claim 7, wherein the pixel power source FPCBs are bonded to a plurality of pixel power source out lead bonding (OLB) pads located on each of the external side edges of the organic light emitting display panel and electrically coupled to the pixel power source OLB pads.

10. The method as claimed in claim 7, wherein the first region is located closer to the display unit than the second region.

11. The method as claimed in claim 7, wherein the TCPs are bonded by positioning one end of each of the TCPs to overlap a signal out lead bonding (OLB) pad located in the first region, interposing an anisotropic conductive film (ACF) between the TCPs and the signal OLB pads, and applying heat and pressure using hot bars.

12. The method as claimed in claim 7, wherein the pixel power source FPCBs bonded to a same one of the external side edges together with the TCPs are bonded by positioning one end of each of the FPCBs to overlap a pixel power source out lead bonding (OLB) pad located in the second region, interposing an anisotropic conductive film (ACF) between the FPCBs and a plurality of signal OLB pads, and applying heat and pressure using hot bars.

* * * * *